(12) United States Patent
Neftin et al.

(10) Patent No.: US 9,631,791 B2
(45) Date of Patent: Apr. 25, 2017

(54) INTEGRATED INTERCONNECT AND REFLECTOR

(75) Inventors: Shimon Neftin, Kiryat Shmone (IL); Rami Mirski, Haifa (IL)

(73) Assignee: BRIGHT LED LTD., Haifa (IL)

( * ) Notice: Subject to any disclaimer, the term of this patent is extended or adjusted under 35 U.S.C. 154(b) by 409 days.

(21) Appl. No.: 14/129,550

(22) PCT Filed: Jun. 27, 2012

(86) PCT No.: PCT/IL2012/000263
§ 371 (c)(1),
(2), (4) Date: Feb. 10, 2014

(87) PCT Pub. No.: WO2013/001528
PCT Pub. Date: Jan. 3, 2013

(65) Prior Publication Data
US 2014/0204585 A1 Jul. 24, 2014

Related U.S. Application Data

(60) Provisional application No. 61/501,272, filed on Jun. 27, 2011.

(51) Int. Cl.
*F21V 7/22* (2006.01)
*H01L 33/60* (2010.01)
*H01L 33/62* (2010.01)
*H01L 33/64* (2010.01)

(52) U.S. Cl.
CPC ............... *F21V 7/22* (2013.01); *H01L 33/60* (2013.01); *H01L 33/62* (2013.01); *H01L 33/647* (2013.01); *H01L 2224/48091* (2013.01); *H01L 2224/48472* (2013.01); *Y10T 29/49* (2015.01)

(58) Field of Classification Search
CPC .................... H01L 33/60; H01L 33/62; H01L 2224/48091; H01L 2224/48472; H01L 2924/00014; Y10T 29/49
See application file for complete search history.

(56) References Cited

U.S. PATENT DOCUMENTS

| 6,480,389 B1 | 11/2002 | Shie |
| 6,670,704 B1 | 12/2003 | Neftin |
| 2004/0211970 A1 | 10/2004 | Hayashimoto |

(Continued)

FOREIGN PATENT DOCUMENTS

| WO | 2004/049424 A2 | 6/2004 |
| WO | 2007/039892 A2 | 4/2007 |

*Primary Examiner* — Y M Lee
(74) *Attorney, Agent, or Firm* — Roach Brown McCarthy & Gruber, P.C.; Kevin D. McCarthy

(57) ABSTRACT

A reflector interconnect having a front surface and a back surface is disclosed. The reflector interconnect comprises at least two segments of a reflector valve metal and at least one segment of an oxide of the reflector valve metal, wherein the at least two segments of the reflector valve metal are electrically isolated from each other by the at least one segment of the oxide of the reflector valve metal. The reflector interconnect is configured to support one or more electric components attached on the front surface in direct thermal contact with the reflector interconnect. The reflector interconnect is curved so that electromagnetic radiation radiated by at least one of the one or more electric components is reflected from the front surface and focused to a beam.

20 Claims, 9 Drawing Sheets

(56) References Cited

U.S. PATENT DOCUMENTS

| | | |
|---|---|---|
| 2005/0275960 A1 | 12/2005 | Wu |
| 2007/0029570 A1 | 2/2007 | Shin |
| 2007/0062032 A1 | 3/2007 | Ter-Hovhannissian |
| 2010/0255274 A1 | 10/2010 | Mirsky |
| 2010/0314641 A1 | 12/2010 | Schmidt |
| 2012/0112238 A1 | 5/2012 | Mirsky |
| 2012/0313115 A1* | 12/2012 | Joo .................. H01L 33/60 257/88 |

* cited by examiner

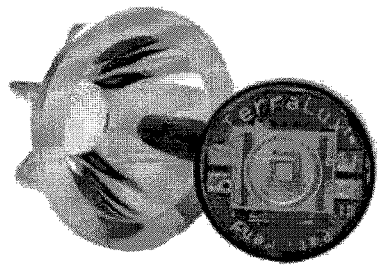
Figure 1A     (prior art)
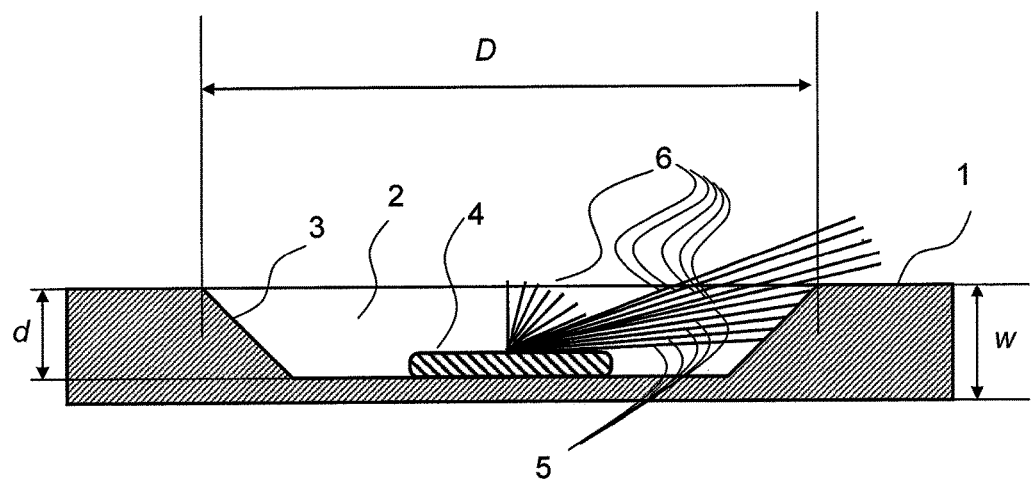
Figure 1B     (prior art)

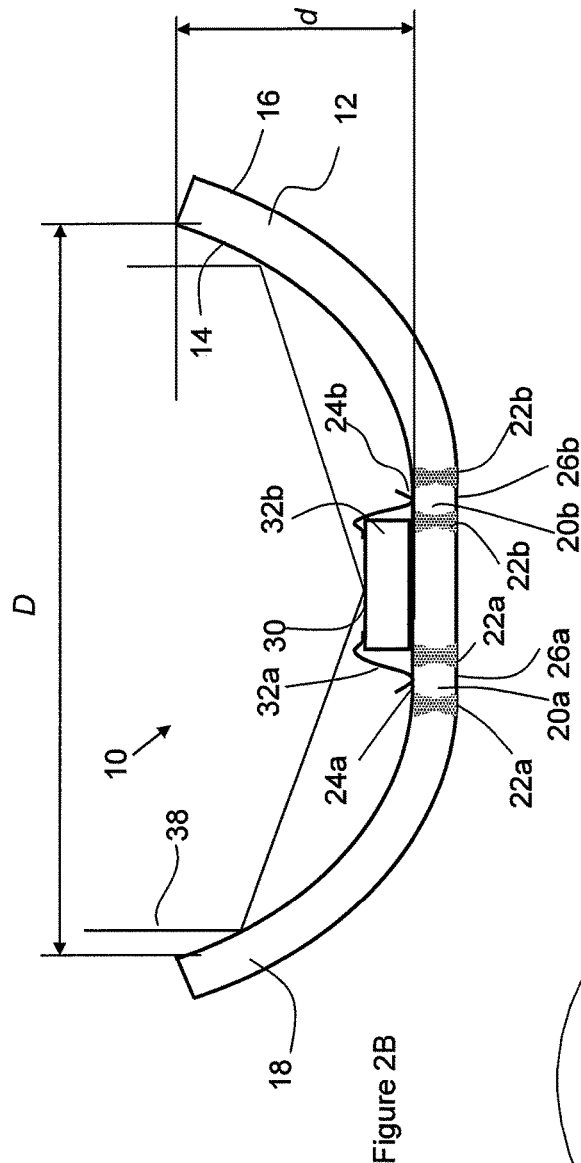
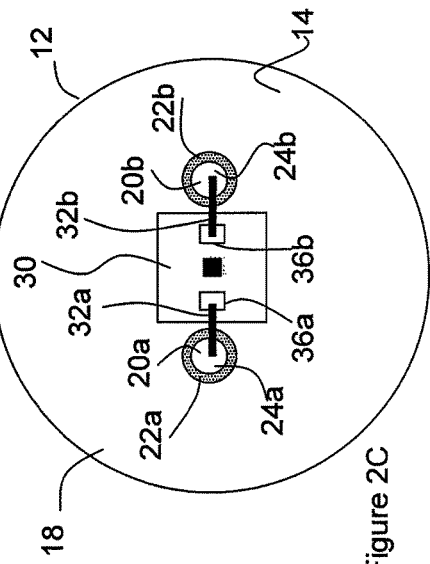
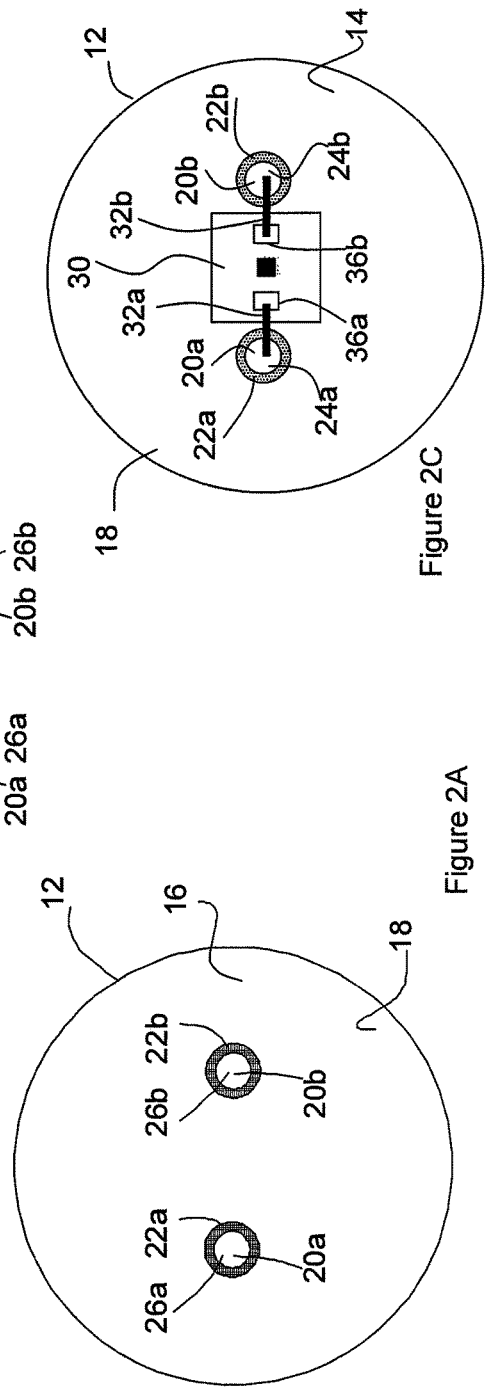
Figure 2B
Figure 2C
Figure 2A

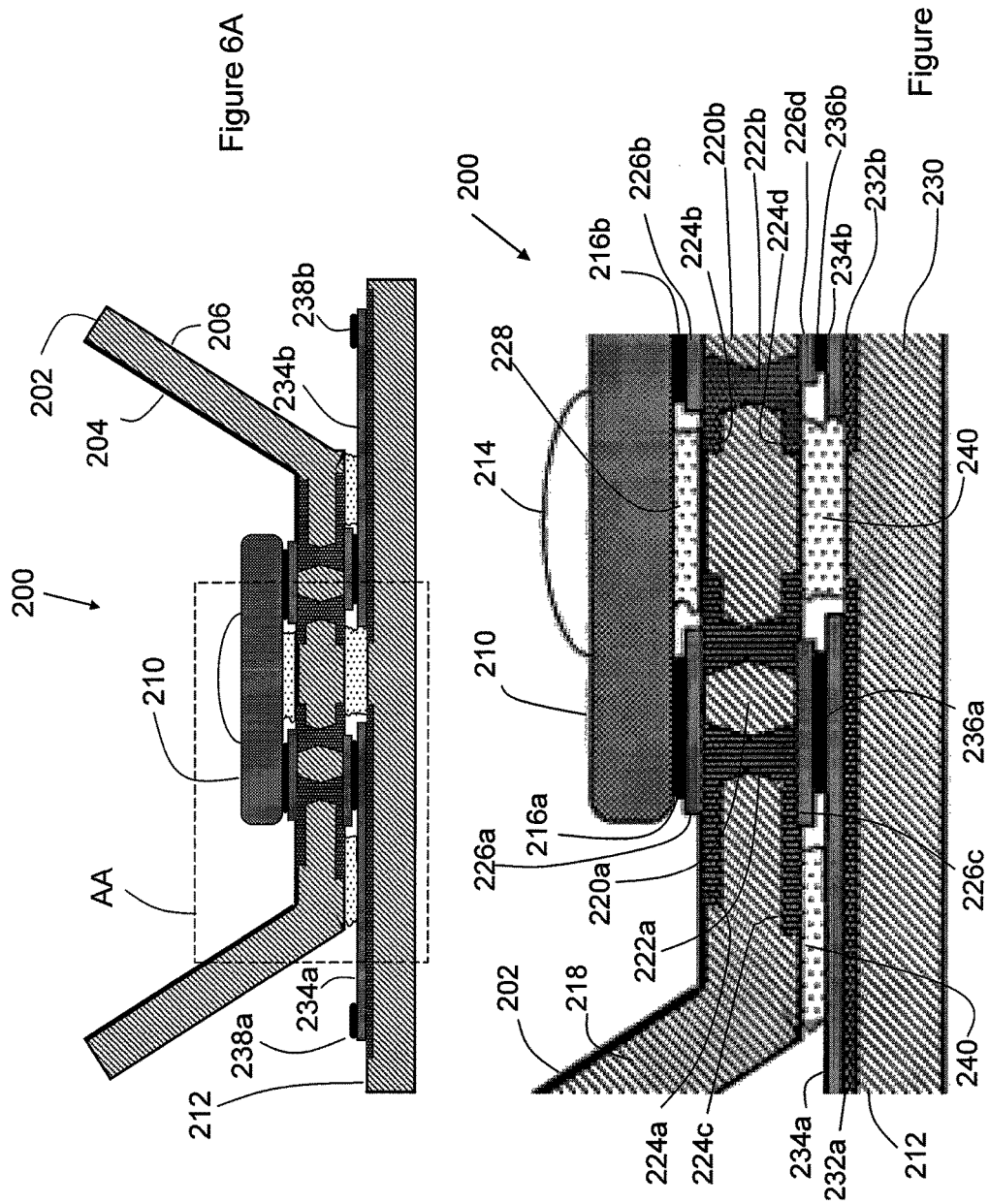

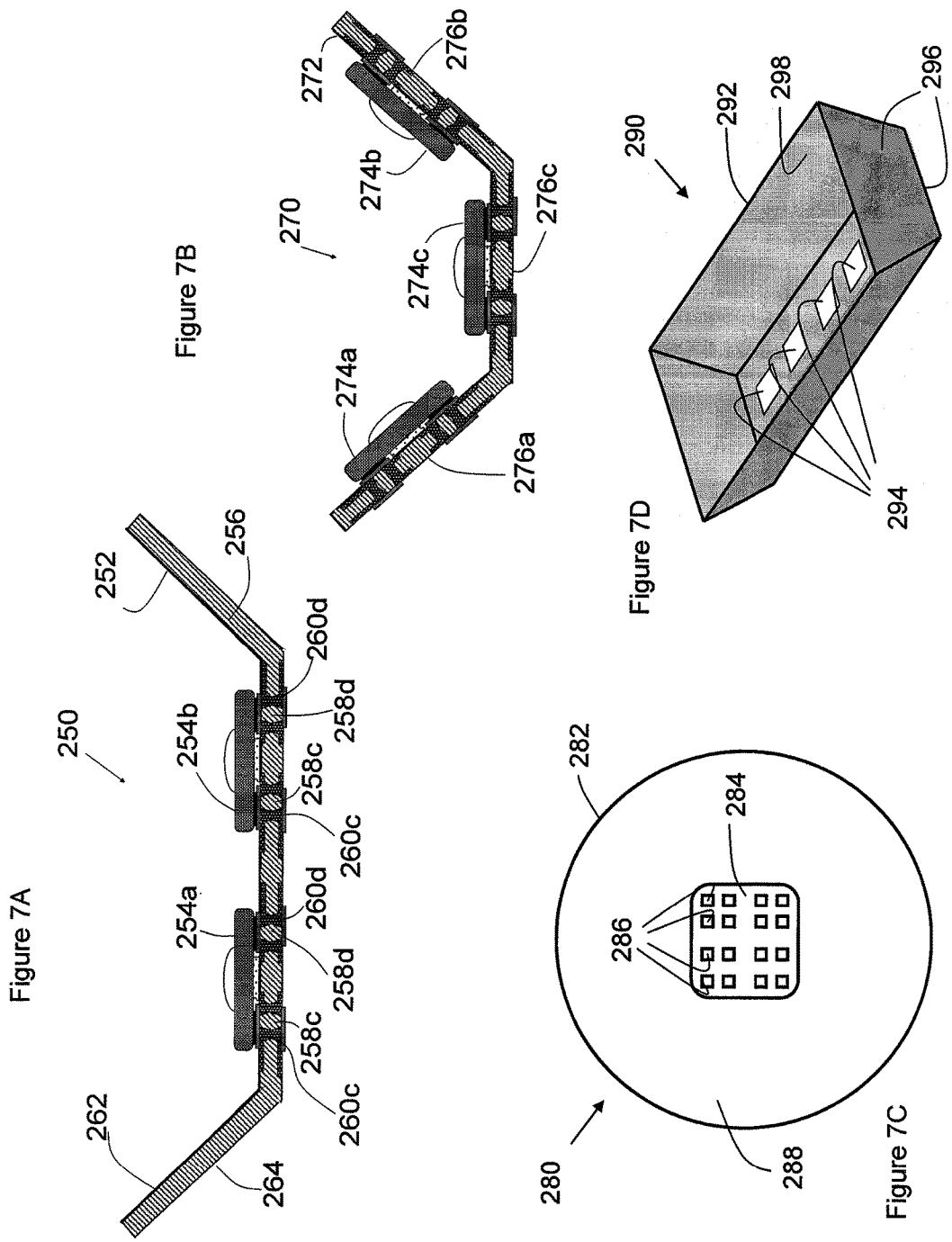

INTEGRATED INTERCONNECT AND REFLECTOR

FIELD AND BACKGROUND OF THE INVENTION

The invention, in some embodiments, relates to the field of electric interconnect substrates and more particularly, but not exclusively, to electric interconnect substrates that in some embodiments are configured to support radiating electric components.

An interconnect substrate is a key element in the electronics industry. In a typical basic form, an interconnect substrate provides a platform for electro-mechanical attachment of electronic components. A plurality of electronic components, that are typically functionally associated together in one or more electric circuits, may be assembled and physically attached to such an interconnect substrate. The interconnect substrate provides the required electric interconnection between the components, as well as mechanical support that retains the mechanical integrity of the assembly. A well known example of such an interconnect substrate is a printed circuit board (PCB), to which electronic components may be attached by soldering.

In more advanced applications an interconnect substrate may provide, in addition to mechanical support and electric interconnect, also an effective means for removal of heat from the electric components attached thereon. Generally, heat removal from heat-generating electric components may be a considerable challenge in electronic circuitry design and employment. An interconnect substrate that comprises e.g. materials having high thermal conductance may provide solution to the challenge, by providing a channel for efficient heat removal, by facilitating heat flow from the heat generating electric components to the interconnect substrate, and further within the interconnect substrate itself. U.S. Pat. No. 6,670,704, US patent application 2010/0255274 and PCT patent application WO04049424 disclose a substrate interconnect comprising a valve metal such as aluminum, and an oxide of the valve metal, suitable, in some embodiments, for efficiently removing heat from heat generating components attached to the substrate interconnect. The valve metal in such substrate interconnects provides high thermal conductivity resulting in an efficient heat removal from hot regions, generally associated with heat sources such as heat-generating electric components, to cooler regions of the substrate. Segments of oxide of the substrate interconnect provides for electrical isolation, enabling distinct conductive channels which are electrically isolated from each other by the oxide segments.

Recent progress in the field of Light Emitting Diodes (LED's) is making high-power, high-efficiency light sources available for a large variety of usages. Hand-held flashlights, interior saloon lighting and exterior lights for cars, and various lighting solutions for the home, have found in such high-power, high-efficiency LEDs an attractive solution. Yet, even with such recent progress in LEDs technology, a significant percentage—in some instance even above 50%—of the electric energy consumed by a LED device, is transformed into heat. Electronic components are generally adversely affected by high temperatures, and semiconductor junctions such that exist in LEDs might particularly suffer an increased likelihood of failure and shortening of operative life time with an increase of their operating temperatures. Thus, a substrate interconnect that can efficiently remove heat from heat-generating electric components, and particularly from LEDs assembled thereon, may be advantageous over other interconnects that remove heat less efficiently.

US patent application 2012/0112238 discloses a LED substrate and packaging for a single diode or a diode array. The substrate includes an integral reflector(s) for the diode(s) in the form of a shaped cavity (or cavities) to house the diode die(s). The reflector cavity walls can optionally be plated with a reflective material and may include a molding material to serve as lens and sealant. Also described is a method for building a substrate with direct metal connection of low thermal path between a die and a bottom surface of the substrate. Cavity formation is carried out by thinning the substrate in a desired region, in and around the region where a LED is to be installed, using techniques such as mechanical formation (drilling, punching, and the like), chemical etch formation or electro-chemical etching.

SUMMARY OF THE INVENTION

Aspects of the invention, in some embodiments, relate to the field of electric interconnect substrates. More specifically, but not exclusively, aspects of the invention, in some embodiments, relate to electric interconnect substrates that are configured to support radiating electric components.

According to an aspect of some embodiments there is provided a reflector interconnect having a front surface and a back surface. The reflector interconnect comprises at least two segments of a reflector valve metal and at least one segment of an oxide of the reflector valve metal, and the at least two segments of the reflector valve metal are electrically isolated from each other by the at least one segment of the oxide of the reflector valve metal. The reflector interconnect is configured to support one or more electric components attached on the front surface in direct thermal contact with the reflector interconnect. The reflector interconnect is curved so that electromagnetic radiation radiated by at least one electric component attached to the reflector interconnect on the front surface, is reflected from the front surface and focused to a beam.

According to some embodiments, at least a part of the front surface of the reflector interconnect is configured to have a reflection coefficient of electromagnetic radiation higher than the reflection coefficient of electromagnetic radiation of the back surface of the reflector interconnect. According to some embodiments, the front surface is polished, to have a reflection coefficient of electromagnetic radiation higher than that of the back surface of the reflector interconnect. According to some embodiments, the front surface is optically coated, to have a reflection coefficient of electromagnetic radiation higher than that of the back surface of the reflector interconnect. According to some embodiments, the front surface is polished and optically coated, to have a reflection coefficient of electromagnetic radiation higher than that of the back surface of the reflector interconnect.

According to some embodiments, the electromagnetic radiation is visible light. According to some embodiments, the electromagnetic radiation is infra-red. According to some embodiments, the electromagnetic radiation is microwave radiation.

According to some embodiments, the reflector interconnect consists of a sheet having a substantially constant thickness. According to some embodiments, the reflector interconnect has a thickness between about 50 um and about 1000 um. According to some embodiments, the reflector interconnect has a thickness between about 100 um and about 500 um. According to some embodiments, the reflector interconnect has a thickness equal to about 300 um. According to some embodiments, the reflector interconnect has a thickness equal to about 400 um.

According to some embodiments, at least one of the at least two valve metal segments in the reflector interconnect extends continuously across the reflector interconnect, between the front surface and the back surface, thereby enabling a conductive channel between a first corresponding region of the front surface and a second corresponding region of the back surface.

According to some embodiments, the at least one segment of the oxide of the reflector valve metal forms a closed loop around the first corresponding region on the front surface and forms a closed loop around the second corresponding region on the back surface and extends continuously between the front surface and the back surface. The at least one segment of the oxide of the reflector valve metal thereby encompasses the at least one of the at least two segments of the reflector valve metal, thereby electrically isolating the at least one of the at least two segments of the reflector valve metal from the other segment of the at least two segments of the reflector valve metal.

According to some embodiments, the reflector interconnect is configured to support one or more electric components on the front surface, in direct thermal contact with the reflector interconnect. At least one electric contact of the electric component electrically contacts the first region of the front surface, thereby enabling electrically interfacing the electric component from the second region of the back surface.

According to an aspect of some embodiments there is provided a reflector, comprising a reflector interconnect as is described above, and one or more electric components supported on the front surface of the reflector interconnect.

According to some embodiments, at least one of the one or more electric components is electrically interfaced from the back surface. According to some embodiments, at least one of the one or more electric components is configured and operable to controllably radiate electromagnetic radiation. According to some embodiments, the at least one electric component comprises a Light Emitting Diode (LED). According to some embodiments, the at least one electric component comprises a plurality of LEDs. According to some embodiments, the at least one electric component comprises an incandescent light bulb. According to some embodiments, the at least one electric component comprises an infra-red source. According to some embodiments, the at least one electric component comprises a microwave source.

According to an aspect of some embodiments there is provided a reflector, comprising a reflector interconnect as is described above, and a substrate interconnect firmly attached to the back surface of the reflector interconnect. The substrate interconnect comprises at least one conductive channel electrically interfacing the second region of the back surface of the reflector interconnect, thereby enabling electrically interfacing an electric component supported on the front surface of the reflector interconnect through the conductive channel of the substrate interconnect.

According to some embodiments, the substrate interconnect comprises a Metal-Core PCB (MCPCB). According to some embodiments, the substrate interconnect comprises ALOX™.

According to some embodiments, the substrate interconnect comprises:
a substrate bulk comprising a segment of a substrate valve metal and a segment of an oxide of the substrate valve metal, and
a metallic conductive channel physically contacting the substrate bulk and electrically isolated from the substrate valve metal by the oxide of the substrate valve metal.

According to some embodiments, the substrate interconnect is in direct thermal contact with the reflector interconnect.

According to an aspect of some embodiments there is provided a method of producing a reflector, comprising:
providing a bulk of a reflector valve metal having a front surface and a back surface;
selectively oxidizing a portion of the bulk, thereby obtaining a reflector interconnect, having at least two segments of reflector valve metal electrically isolated from each other by a segment of oxide of the reflector valve metal, and
curving the reflector interconnect, so that electromagnetic radiation that is reflected from the front surface, is focused to a beam.

According to some embodiments, the method further comprises configuring the reflector interconnect to support one or more electric components attached on the front surface in direct thermal contact with the reflector interconnect.

According to some embodiments, the method further comprises configuring the front surface of the reflector interconnect to have a reflection coefficient of electromagnetic radiation higher than a reflection coefficient of electromagnetic radiation of the back surface of the reflector interconnect.

According to an aspect of some embodiments there is provided a light source comprising a reflector as is described above. At least one LED is supported on the front surface of the reflector interconnect, and the light source is electrically associated with an electric power source, thereby being operable to emit light.

Aspects and embodiments of the invention are described in the specification hereinbelow and in the appended claims.

Unless otherwise defined, all technical and scientific terms used herein have the same meaning as commonly understood by one of ordinary skill in the art to which this invention pertains. In case of conflict, the patent specification, including definitions, takes precedence.

As used herein, the terms "comprising", "including", "having" and grammatical variants thereof are to be taken as specifying the stated features, integers, steps or components but do not preclude the addition of one or more additional features, integers, steps, components or groups thereof. These terms encompass the terms "consisting of" and "consisting essentially of".

As used herein, the indefinite articles "a" and "an" mean "at least one" or "one or more" unless the context clearly dictates otherwise.

BRIEF DESCRIPTION OF THE FIGURES

Some embodiments of the invention are described herein with reference to the accompanying figures. The description, together with the figures, makes apparent to a person having ordinary skill in the art how some embodiments of the invention may be practiced. The figures are for the purpose of illustrative discussion and no attempt is made to show structural details of an embodiment in more detail than is necessary for a fundamental understanding of the invention. For the sake of clarity, some objects depicted in the figures are not to scale.

In the Figures:

FIG. 1A is a commercial product of the prior art comprising a LED and a reflector;

FIG. 1B schematically depicts a LED substrate that includes an integral reflector for the diode in the form of a shaped cavity, according to prior art;

FIGS. 2A, 2B and 2C schematically depict a reflector comprising a reflector interconnect in accordance with the teachings of the disclosure;

FIGS. 6A and 6B schematically depict cross-section side views of a reflector comprising a reflector interconnect and a substrate interconnect in accordance with the teachings of the disclosure; and FIGS. 7A-7D schematically illustrate exemplary embodiments of reflectors each comprising a multitude of LEDs, in accordance with the teachings of the disclosure.

DESCRIPTION OF SOME EMBODIMENTS OF THE INVENTION

Figure 3:
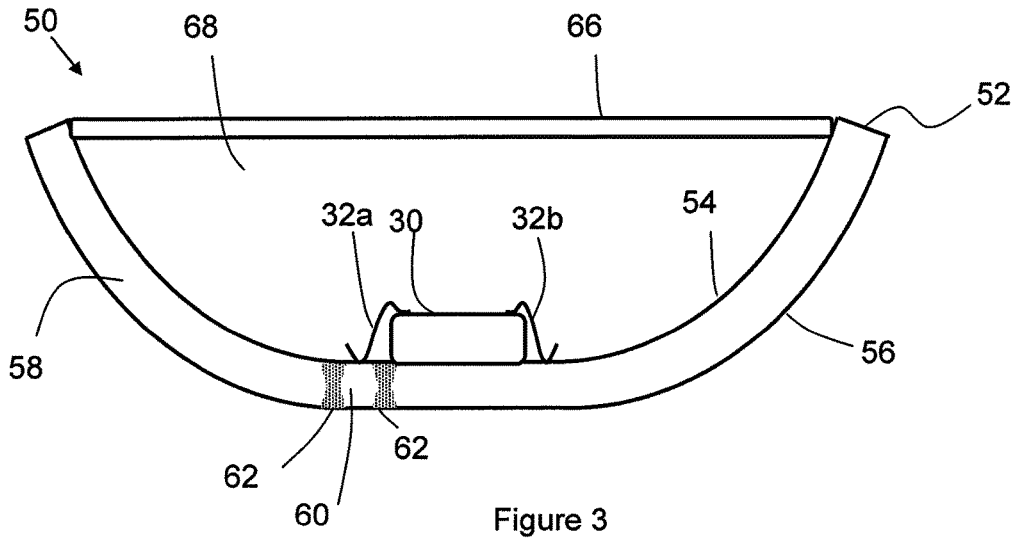
FIG. 3 schematically depicts a reflector comprising a reflector interconnect in accordance with the teachings of the disclosure.

The principles, uses and implementations of the teachings herein may be better understood with reference to the accompanying description and figures. Upon perusal of the description and figures present herein, one skilled in the art is able to implement the invention without undue effort or experimentation.

Before explaining at least one embodiment in detail, it is to be understood that the invention is not necessarily limited in its application to the details of construction and the arrangement of the components and/or methods set forth herein. The invention is capable of other embodiments or of being practiced or carried out in various ways. The phraseology and terminology employed herein are for descriptive purpose and should not be regarded as limiting.

As mentioned above, light sources comprising high power LEDs are quickly becoming widespread in various fields of use, e.g. for lighting in homes, in cars and in portable flashlights. A typical commercial product comprising one or more LED dies may further comprise a substrate interconnect such as a PCB on which the LED or LEDs are attached, possibly together with other electronic components, and a reflector, used to focus the emitted light to a beam. FIG. 1A shows a commercial product by Terralux™, Mini Star 2 Extreme for Mini Maglite 2AA Flashlights. Generally, heat that is generated in the LED during operation is dissipated primarily by flowing from the LED to the substrate interconnect, by radiation and possibly by convection of air. The reflector, being attached to the substrate interconnect, with no direct thermal contact with the LED, does not contribute significantly to heat dissipation. There is thus a need in the art for a reflector to be used with a high power LED, or with a plurality of such LEDs, and that would be in direct thermal contact with the LED so as to facilitate heat removal from the LED and further facilitate heat dissipation using the relatively large surface area of the reflector.

As discussed above, in US2012/0112238 is disclosed a LED substrate that includes an integral reflector for the diode, in the form of a shaped cavity to house the diode die. FIG. 1B schematically depicts a substrate 1 comprising a cavity 2 having sides 3 and configured to house a LED 4 according to US2012/0112238. However, the solution of US2012/0112238 is suitable for specific usages, for example as a packaging substrate for one or more LED dies (e.g. as a Surface Mount Device (SMD)) and may be less suitable for other usages as is explained below: the cavity that houses the diode is formed substantially by thinning the slab of substrate 1 by a desired extent, in a desired region. Consequently, cavity 2 has a depth d that is limited by the thickness w of the slab. The opening D of the cavity is substantially limited from below by the dimensions of LED 4 that is housed therein, that is to say opening D must be equal to or larger than the dimension of LED 4. The amount of light that is effectively reflected by sides 3 of cavity 2 (as a percentage of the total amount of light emitted by LED 4) is dependent substantially on the aspect ratio d/D, namely the ratio of the depth d to the opening D of cavity 2. The larger the aspect ratio is, a higher percentage of light may be reflected to form a beam. Even in a relatively thick slab, having a thickness of several millimeters (e.g. 6 mm), the aspect ratio of the cavity might be relatively small, and sides 3 of cavity 2 might cover a relatively small solid angle over which light 5 emitted from LED 4 can be reflected. As a result, the fraction of light 5 reflected to form a beam of the total amount of light emitted by LED 4 might be limited, and a large fraction of the light 6 might diverge at relatively large angles. The efficiency of effective reflection in the solution of US2012/0112238 is therefore limited by the fundamental characteristics of the solution.

Another shortcoming of the solution of FIG. 1B is related to the absolute dimensions of a light emitting device that can be housed in the cavity. Light from such a light emitting device can reach sides 3 of cavity 2 (and be reflected to form a beam) only if the light emitting device has a thickness (height) that is smaller than the depth d of cavity 2. Because the typical depth of cavity 2 is in the range of a few millimeters, the solution of FIG. 1B may be suitable for example for a bare LED chip (having a thickness of about 1 millimeter or less), but may be less suitable for a Surface Mount Device (SMD) comprising a LED chip installed on a substrate and having length, width and thickness of about 5 millimeters or more.

Yet another deficiency of the solution of FIG. 1B relates to manufacturing a device according to US2012/0112238: processes that include mechanical thinning are typically complex, expensive, and impose restrictions on other steps in the process. For example, producing cavity 2 in FIG. 1B by thinning must evidently be carried out prior to installing LED 4.

Thus, according to an aspect of some embodiments of the invention, there is provided a reflector interconnect having a front surface and a back surface. The reflector interconnect comprises at least two segments of a reflector valve metal and at least one segment of an oxide of the reflector valve metal, and the at least two segments of reflector valve metal are electrically isolated from each other by the segment of oxide of the reflector valve metal. The reflector interconnect is configured to support one or more electric components attached on the front surface in direct thermal contact with the reflector interconnect. Further, the reflector interconnect is curved, so that electromagnetic radiation radiated by such an electric component (being attached to the reflector interconnect on the front surface), and reflected from the front surface, is focused to a beam. According to some embodiments, such an electric component may controllably radiate electromagnetic radiation in the form of visible light. According to some embodiments, such an electric component may comprise a light emitting diode (LED).

According to some embodiments, the term "reflector valve metal" refers herein to any valve metal suitable for use in the reflector interconnect. The term is used to distinguish the valve metal of the reflector interconnect from a valve metal that may be used in other elements of embodiments described herein, such valve metal in other elements may be the same or different from the reflector valve metal, as is explained further below.

FIGS. 2A, 2B and 2C schematically depict an embodiment of a reflector 10 according to an aspect of the invention. FIG. 2A depicts a bottom view of reflector 10, FIG. 2B depicts a cross-section side view of reflector 10 and FIG. 2C depicts a top view of reflector 10. Reflector 10 comprises a reflector interconnect 12 having a front surface 14 and a back surface 16. Reflector interconnect 12 is segmented to a reflector segment 18 and to two contact segments 20a and 20b, substantially consisting of a valve metal and therefore electrically conductive. Reflector interconnect 12 further comprises two ring shaped segments 22a and 22b, each encompassing contact segment 20a and contact segment 20b, respectively, and substantially consisting of an oxide of the valve metal (and are therefore electrically isolating). For example segments 18, 20a and 20b may consist substantially of aluminum, and segments 22a and 22b may consist substantially of aluminum oxide (alumina).

Ring segment 22a forms a closed loop in a shape of a ring around contact segment 20a in bottom view, FIG. 2A. Further, ring segment 22a extends continuously from front surface 14 to back surface 16 in cross section side view, FIG. 2B. Consequently, contact segment 20a does not contact reflector segment 18, and is therefore electrically isolated from reflector segment 18. Similarly, contact segment 20b is electrically isolated from reflector segment 18 by ring segment 22b.

Segments 20a and 20b each extends continuously across reflector interconnect 12, between front surface 14 and back surface 16. Segment 20a, consisting substantially of valve metal which is electrically conductive, thus enables a conductive channel between region 24a on front surface 14, and region 26a on back surface 16. Likewise, Segment 20b enables a conductive channel between region 24b on front surface 14, and region 26b on back surface 16. According to some embodiments, reflector interconnect 12 is made of a valve metal sheet having a substantially constant thickness. According to some embodiments reflector interconnect 12 has a thickness that is large enough to provide for self-supporting mechanical strength. According to some embodiments reflector interconnect 12 has a thickness that is small enough to allow for transforming ring segments 22a and 22b into an oxide by selectively anodizing a desired region of one of front surface 14 and back surface 16. According to some embodiments reflector interconnect 12 has a thickness that is small enough to allow for transforming ring segments 22a and 22b into an oxide by selectively anodizing desired regions, substantially corresponding to one another, of front surface 14 and back surface 16A. According to some embodiments reflector interconnect 12 has a thickness between about 50 um and about 1000 um. According to some embodiments reflector interconnect 12 has a thickness between about 100 um and about 500 um. According to some embodiments reflector interconnect 12 has a thickness equal to about 300 um. According to some embodiments reflector interconnect 12 has a thickness equal to about 400 um.

Reflector 10 is configured to support a heat generating electric component attached on front surface 14 in direct thermal contact with reflector interconnect 12. Reflector 10 is particularly suitable to support an electric component configured and operable to controllably radiate electromagnetic radiation. Controllably radiating electromagnetic radiation refers to radiating electromagnetic radiation within a substantially pre-selected range of frequencies, and it is distinguished from emitting heat as a side effect of the mere operation of the electric component. Examples of electric components that are configured and operable to controllably radiate electromagnetic radiation and are suitable to be supported by reflector 10 are visible light sources such as a Light Emitting Diode (LED) or an incandescent light bulb; infra-red sources; and microwave sources.

FIG. 2B depicts schematically a LED package 30, comprising a LED chip (not shown), attached firmly to reflector interconnect 12 on front surface 14, thus having a direct thermal contact with reflector interconnect 12. LED package 30 may be attached firmly to reflector interconnect 12 as described above by any suitable method, for example by a thermally conductive adhesive layer spread between LED package 30 and front surface 14. Two contact leads 32a and 32b, respectively, electrically connect the LED package electric contacts 36a and 36b, with contact segments 20a and 20b, respectively, thus enabling electrically interfacing LED package 30 from back surface 16 and through reflector interconnect 12.

Reflector interconnect 12 is curved so that light 38 emitted from the LED on LED package 30 and reflected from front surface 14 is focused to a beam. According to some embodiments reflector interconnect 12 is curved by suitably bending reflector interconnect 12, for example by pressing reflector interconnect 12 is a press, to obtain a desired curved shape.

As discussed above and according to some embodiments, reflector 10 is configured to efficiently reflect light that is emitted by the LED on LED package 30. Accordingly, front surface 14 is configured to have a high reflection coefficient, particularly for light emitted by the LED. Additionally, reflector 10 is configured to facilitate dissipation of heat that is generated by LED package 30. According to some embodiments, reflector 10 is configured to dissipate heat by radiation from reflector interconnect 12. It is noted that generally, a trade-off exists between reflection and emission of electromagnetic radiation: a surface that has a relatively high reflection coefficient might have a relatively low emissivity, and a surface that has a relatively low reflection coefficient may have a relatively high emissivity. For example, an optically-polished surface of aluminum may have a relatively high reflection coefficient of about 0.9 for visible light, and a relatively low total emissivity of about 0.06. According to some embodiments, reflector interconnect 12 is configured to efficiently reflect light from front surface 14, and to efficiently emit heat from back surface 16. According to some embodiments, front surface 14 of reflector interconnect 12 is configured to have reflection coefficient of electromagnetic radiation higher than the reflection coefficient of back surface 16. According to some embodiments, front surface 14 is polished, to obtain a high reflection coefficient (from the metallic segments thereof). According to some embodiments, front surface 14 is suitably coated to obtain a high reflection coefficient. According to some embodiments, back surface 16 is suitably coated, for example by a black and opaque coating, to obtain a low reflection coefficient, thereby obtaining high emissivity of back surface 16.

It is noted that in a curved reflector such as reflector 10 of FIG. 2, the aspect ratio d/D is not limited by the thickness of the substrate interconnect and may generally be much larger than in a reflector such as that of FIG. 1B. According to some embodiments, a reflector having a typical depth d of 10 millimeters, for example for housing a LED or a LED package with typical dimensions of about 5 mm, can be manufactured. According to some embodiments a reflector having a depth d of 20 mm can be manufactured, and according to some embodiments even a reflector having a depth d of 100 mm can be manufactured.

A greater depth d generally corresponds also to a greater surface area of the reflector. A greater surface area increases heat dissipation, possibly both by radiation and by convection of air. An additional advantage of a reflector such as reflector 10 according to the teachings herein over the solution of the prior art of FIG. 1B is therefore greater heat dissipation, resulting in better heat management, lower operating temperatures and increased life time of the electronic components assembled thereon. An advantage of a reflector such as reflector 10 over a commercial product such as in FIG. 1A is providing for an interconnect for the LED, thereby enabling electrically interfacing the LED through the reflector. Yet a further advantage over some commercially available reflectors is having a direct thermal contact with the LED or the LED package attached thereon, thereby allowing for a more efficient heat flow from the LED to the reflector.

FIG. 3 schematically depicts an embodiment of a reflector 50 according to an aspect of the invention. Reflector 50 comprises a reflector interconnect 52 which is substantially similar to reflector interconnect 12 of FIG. 2, apart from having only two metallic segments isolated from each other by an oxide segment. Reflector interconnect 52 comprises a reflector segment 58 and a single contact segment 60, both made of a valve metal. Reflector interconnect 52 further comprises a ring segment 62, encompassing contact segment 60, thereby electrically isolating reflector segment 58 from contact segment 60. Contact lead 32a electrically connects an electric contact (not shown) of LED package 30 with contact segment 60. Contact lead 32b electrically connect another electric contact of LED package 30 with reflector segment 58. Reflector segment 58 is thus employed as a conductive channel, allowing, together with contact segment 60, electrically interfacing LED package 30 from back surface 56 of reflector interconnect 52.

According to some embodiments, reflector 50 further comprises a diffuser 66 attached to reflector interconnect 52 so that light emitted by LED package 30 (and optionally reflected by reflector interconnect 52) passes diffuser 66. According to some embodiments diffuser 66 comprises a translucent, semi-transparent slab, thereby scattering light passing therethrough. According to some embodiments diffuser 66 comprises a transparent slab, so that light passing through is substantially not scattered. According to some embodiments diffuser 66 is sealed to reflector interconnect 52 so that an interior space 68 between diffuser 66 and front surface 54 is sealed and liquid such as water, or gases such as air, cannot penetrate through. According to some embodiments, diffuser 66 comprises a bulk material that fills some or all interior space 68 of reflector interconnect 52.

Figure 4:
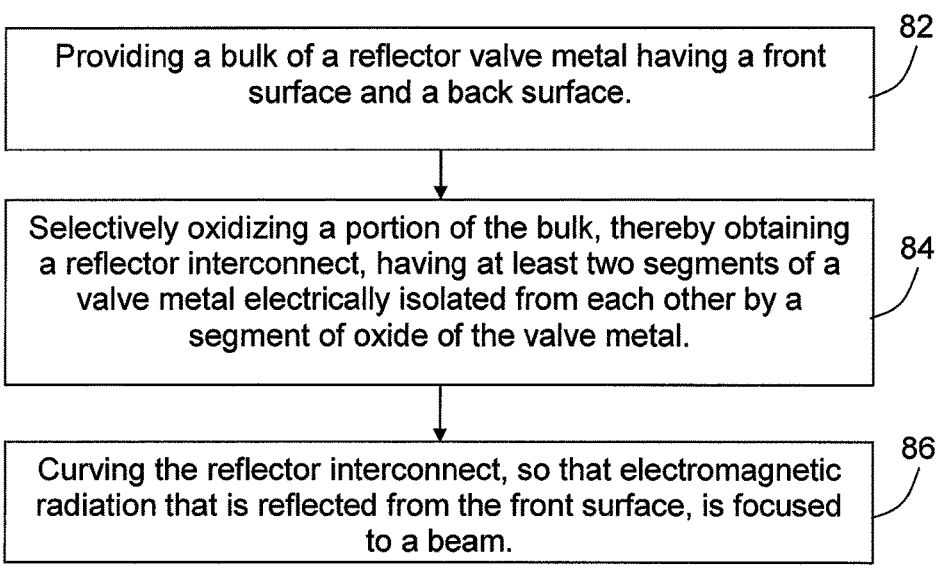
FIG. 4 schematically depicts a flow chart of a method of producing a reflector in accordance with the teachings of the disclosure.

FIG. 4 schematically depicts a flow chart of an embodiment of a method of producing a reflector according to an aspect of the invention. The method may include step 82 of providing a bulk of a reflector valve metal having a front surface and a back surface. The method may further include step 84 of selectively oxidizing a portion of the bulk, thereby obtaining a reflector interconnect, having at least two segments of reflector valve metal, electrically isolated from each other by a segment of oxide of the reflector valve metal. The method may further include step 86 of curving the reflector interconnect, so that electromagnetic radiation that is reflected from the front surface, is focused to a beam.

It is noted that the method of FIG. 4 is considerably advantageous over the method disclosed in US2012/0112238. The method of FIG. 4 enables a simpler manufacturing of a reflector according to the teachings of the disclosure, compared to that of the reflector of the prior art in FIG. 1B. A thinning step, which is generally complex and expensive, is not required, and a reflector shape is obtained by a step of curving the reflector interconnect, which is generally cheaper to perform. Also, according to some embodiments, the method may include a step of attaching a LED to the reflector e.g. by soldering, as is detailed further below in FIG. 5. According to some embodiments the attaching step of the LED may be prior to step 66 in FIG. 4 of curving the reflector interconnect. According to some embodiments, the step of attaching the LED to the reflector may be subsequent to step 66 of curving the reflector interconnect. Thus the method disclosed herein allows greater flexibility in manufacturing.

Figure 5A:
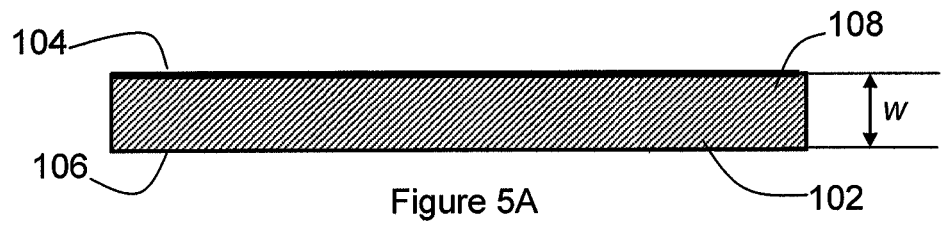
FIGS. 5A-5O schematically illustrates cross-section side views of a bulk of a valve metal, in sequential stages of producing a reflector in accordance with the teachings of the disclosure.
Figure 5B:
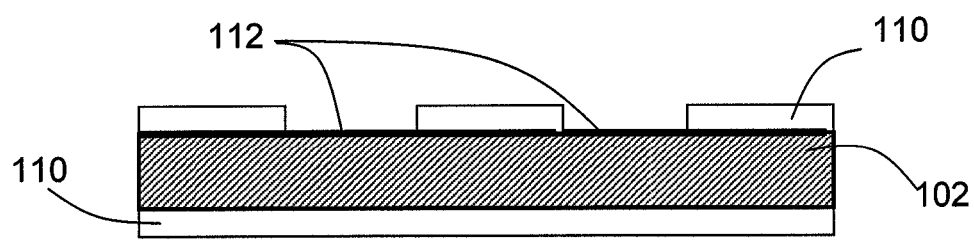
Figure 5C:
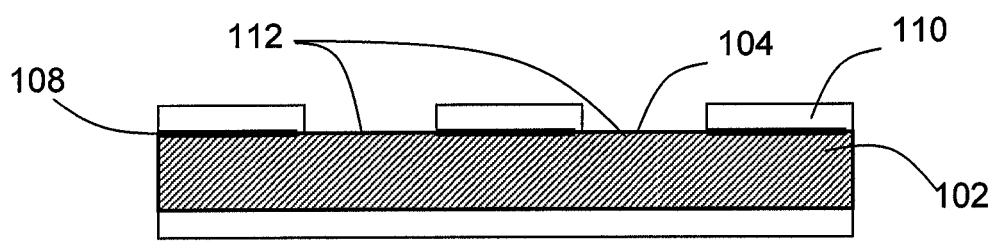
Figure 5D:
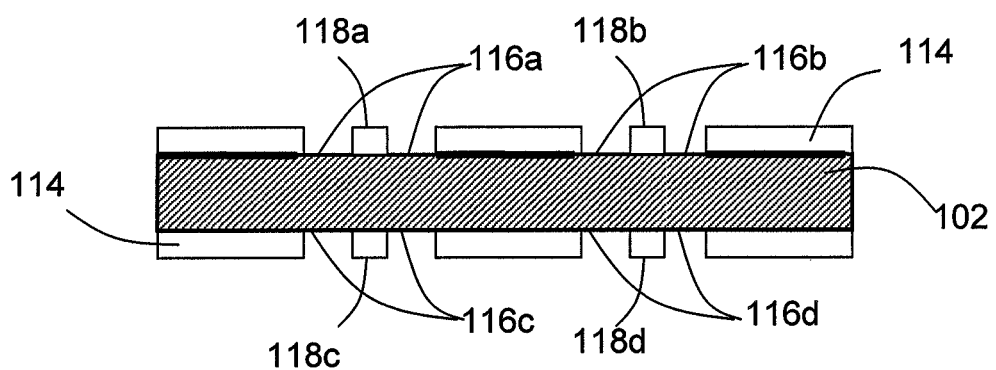
Figure 5E:
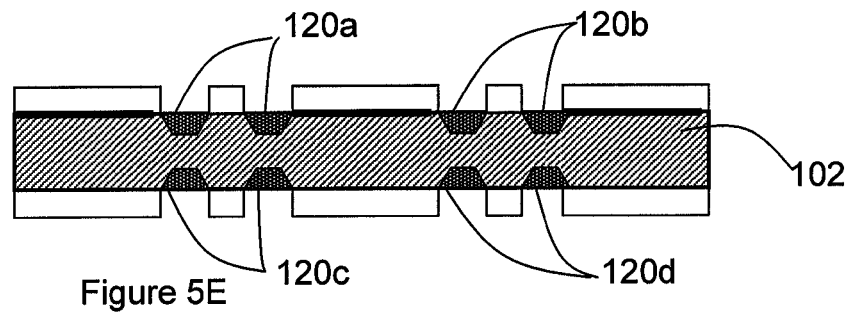
Figure 5F:
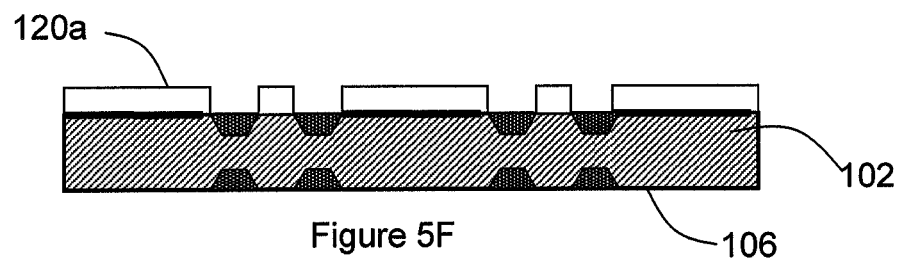
Figure 5G:
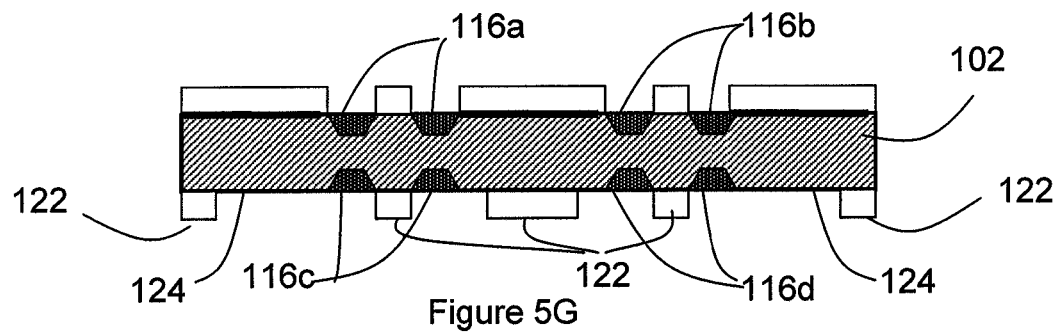
Figure 5H:
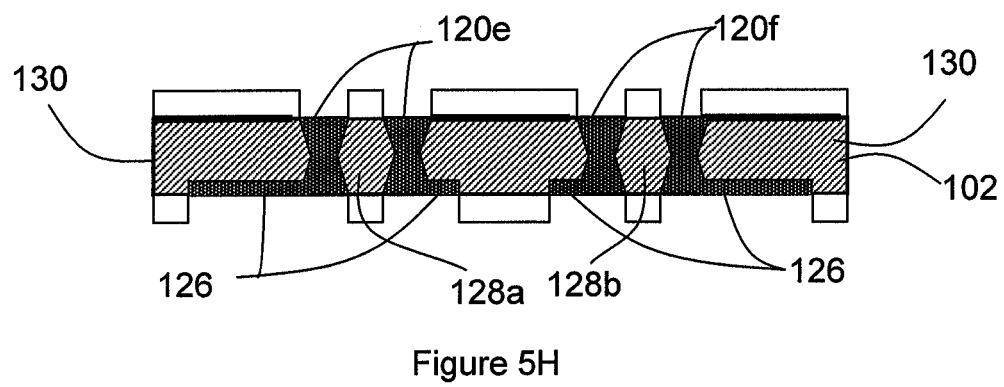
Figure 5I:
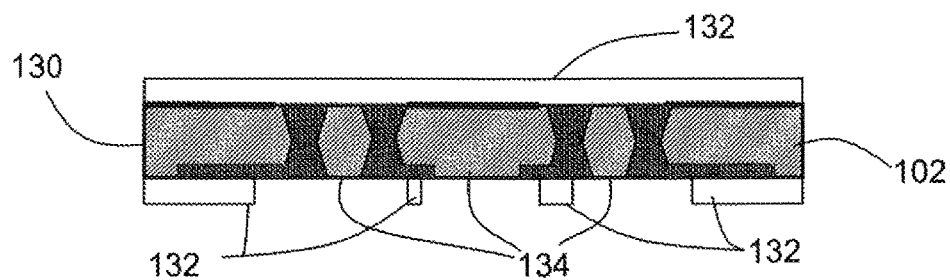
Figure 5J:
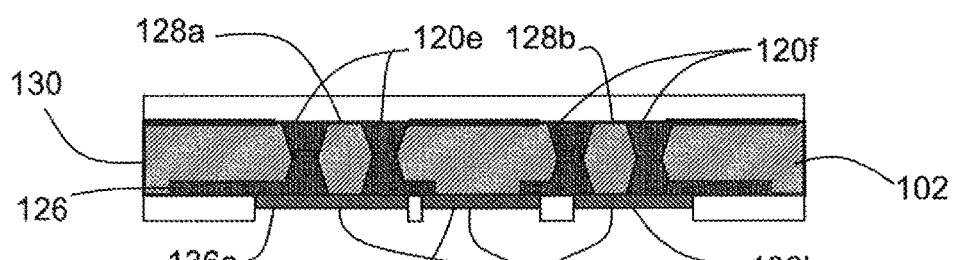
Figure 5K:
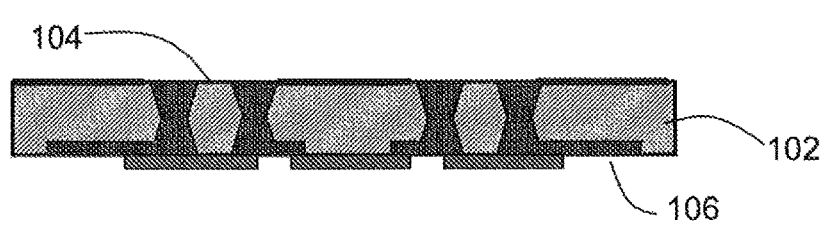
Figure 5L:
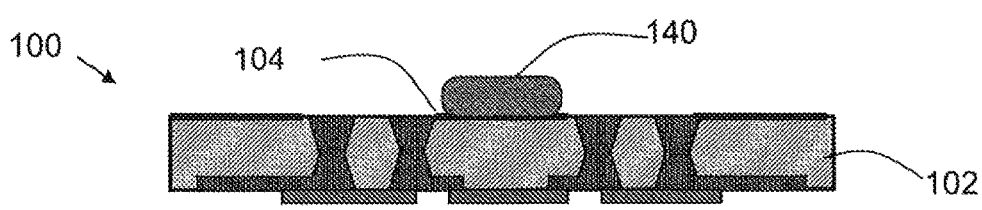
Figure 5M:
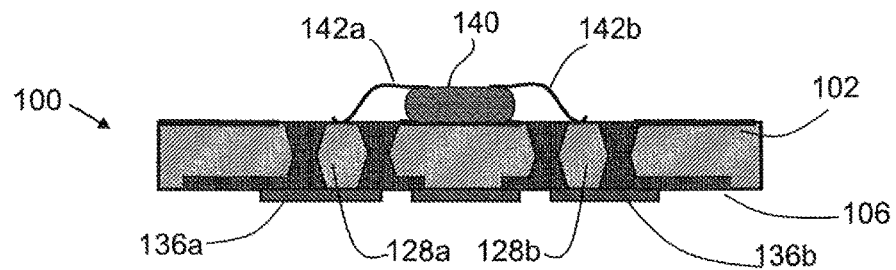
Figure 5N:
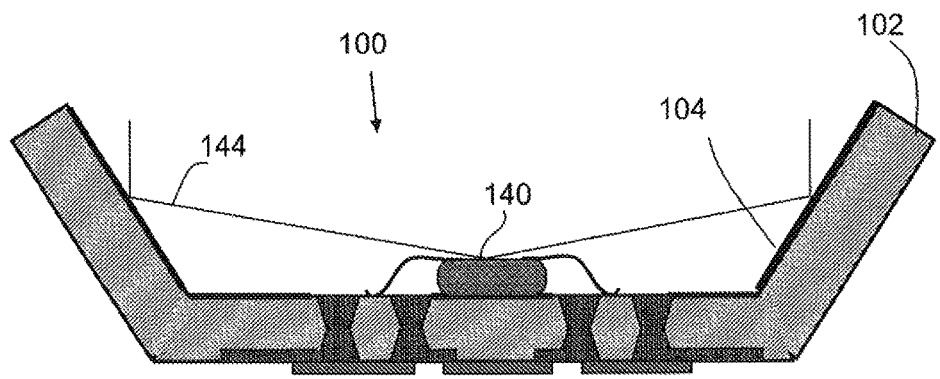
Figure 5O:
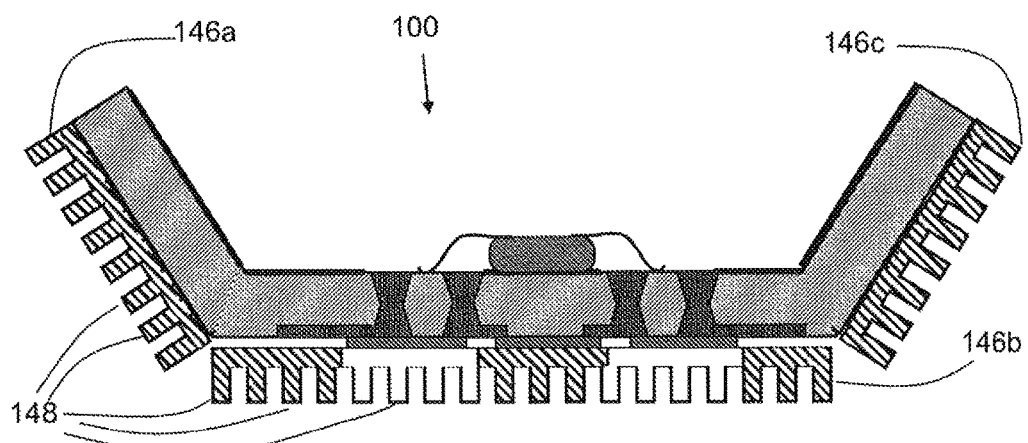

FIGS. 5A-5O schematically illustrate cross-section side views of a bulk 102 of a valve metal, in sequential stages of producing a reflector 100, according to an aspect of the invention. FIG. 5A schematically depicts bulk 102, having a front surface 104 and a back surface 106 and having a thickness d of about 300 um. Front surface 104 is configured to have a reflection coefficient higher than a reflection coefficient of back surface 106. According to some embodiments front surface 104 is suitably coated with a coating 108, thereby having a higher reflection coefficient than back surface 106. Coating 108 is substantially an electric isolator, and must be removed from regions where electric contact with the valve metal of bulk 102 is desired.

FIG. 5B schematically depicts bulk 102 with a first masking 110, deployed selectively on front surface 104 and back surface 106. First masking 110 may be a suitable masking, such as a photoresist, configured to be selectively deployed on surfaces such as front surface 104 and back surface 106. First masking 110 is deployed selectively so as to cover all of back surface 106 and regions of front surface 106 selected to remain coated by coating 108, and to leave uncovered regions 112 of front surface 104 selected to have coating 108 removed from. FIG. 5C schematically depicts bulk 102 having coating 108, of front surface 104, selectively removed from regions 112 wherein masking 110 is absent. Such selective removal of coating 108 may be carried out for example by etching regions that are uncovered by first masking 110, or by other suitable known techniques.

FIG. 5D schematically depicts bulk 102 with a second masking 114, deployed selectively on front surface 104 and back surface 106. Second masking 114 may be a suitable masking, for example similar to first masking 110. Second masking 114 is selectively deployed to front surface 104 and to back surface 106 so as to leave regions 116 of bulk 102 uncovered, to be oxidized. Each region 116 has a shape of a ring around a respective center region 118—for example region 116a has a ring shape around center region 118a, and so on.

FIG. 5E schematically depicts bulk 102 having segments 120, corresponding to regions 116, oxidized by an anodizing process, thereby rendering bulk 102 to a reflector interconnect. Anodizing may be carried out according to a suitable method of anodizing known in the art. By anodizing a segment, the valve metal in the segment is transformed into an oxide of the valve metal, for example aluminum is transformed into aluminum oxide. Oxidized segments 120 extend into reflector interconnect 102, but not necessarily all the way to the center line of the bulk thickness. Generally, the extent of segments 120 inside reflector interconnect 102 may be determined and controlled by one or more parameters of the anodizing process, such as anodizing electric current, operation voltage, time of anodizing etc.

FIG. 5F schematically depicts reflector interconnect 102 having second masking 114 removed from back surface 106. FIG. 5G schematically depicts reflector interconnect 102 with third masking 122 deployed selectively on back surface 106. Third masking 122 may be a suitable masking, similar to first masking 110 or to second masking 114. Third masking 122 is selectively deployed to back surface 106 so that regions 124 of reflector interconnect 102 are left uncovered, to be oxidized. It is noted that regions 124 include regions 116c and 116d on back surface 106, and that regions 116a and 116b on front surface 104 are also uncovered.

FIG. 5H schematically depicts reflector interconnect 102 having oxide segments 126, corresponding to regions 124, oxidized by anodizing the valve metal of reflector interconnect 102. Further, oxide segments in regions 116 extend deeper into reflector interconnect 102, so that oxide segment 120a is joined with oxide segment 120c, thereby forming a single cylinder-shaped oxide segment 120e and electrically isolating contact segment 128a from the surrounding bulk segment 130. Likewise, oxide segment 120b is joined with oxide segment 120d, thereby electrically isolating contact segment 128b from the surrounding bulk segment 130.

FIG. 5I schematically depicts reflector interconnect 102 with fourth masking 132 deployed selectively on front surface 104 and on back surface 106. Fourth masking 132 may be a suitable masking, possibly similar to masking 110, 114 or 122. Fourth masking 132 is selectively deployed so that regions 134 of back surface are uncovered, to be metal-coated, for example by metal deposition.

FIG. 5J schematically depicts reflector interconnect 102 having metallic deposition on exposed regions 134, thereby forming electric contacts 136a, 136b and 136c. Electric contacts 136 are electrically isolated from each other by oxide segments 120 and 126, wherein electric contact 136a is electrically coupled with contact segment 128a, electric contact 136b is electrically coupled with contact segment 128b and electric contact 136c is electrically coupled with bulk segment 130. FIG. 5K schematically depicts reflector interconnect 102 having all masking removed from front surface 104 and from back surface 106.

FIG. 5L schematically depicts reflector 100 comprising reflector interconnect 102 and a LED 140 attached firmly to front surface 104, thus having a direct thermal contact with reflector interconnect 102. LED 140 may be attached firmly to reflector interconnect 102 by any suitable method, for example by a thermally conductive adhesive layer spread between LED 140 and front surface 104. FIG. 5M schematically depicts reflector 100 wherein contact leads 142a and 142b electrically couple LED 140 with contact segments 128a and 128b, respectively. Thus, LED 140 may be electrically interfaced by electric contacts 136a and 136b on back surface 106, via contact segments 128a and 128b, respectively, inside reflector interconnect 102.

FIG. 5N schematically depicts reflector 100 wherein reflector interconnect 102 is curved by a suitable method as is known in the art, so that light 144 emitted from LED 140 and reflected from front surface 104 is focused to a beam.

According to some embodiments, reflector 100 is curved by press stamping, wherein a die of the press machine has a recess or the like so as not to press directly on LED 140. According to some embodiments, reflector 100 is curved by vacuum forming.

FIG. 5O schematically depicts reflector 100 comprising heat-sinks 146. Heat-sinks 146 are firmly attached to back surface 106 of reflector interconnect 102, thereby having a direct thermal contact with reflector interconnect 102. During operation, heat that may be generated by LED 140 may flow, at least partially, to reflector interconnect 102 wherein such heat may partly be dissipated, e.g. by radiation from reflector interconnect 102, and may partly flow further into heat-sinks 146, to be further dissipated by any suitable mechanism, e.g. by convection of air through fins 148 of heat-sinks 146.

FIGS. 6A and 6B schematically depicts a cross-section side view of an embodiment of a reflector 200 according to an aspect of the invention. FIG. 6B is an enlarged view of the area of rectangle AA of FIG. 6A. Reflector 200 comprises a reflector interconnect 202 having a front surface 204 and a back surface 206. Reflector interconnect 202 is substantially similar to reflector interconnect 102 of FIG. 5, apart from differences that are detailed further below. Reflector 200 further comprises a LED package 210 attached firmly to reflector interconnect 202 on front surface 204, thereby having a direct thermal contact with reflector interconnect 202. LED package 210 is electrically coupled with conductive channels that extend across reflector interconnect 202 between front surface 204 and back surface 20 as is further explained and detailed below, and reflector interconnect 202 thereby allows electrically interfacing LED package 210 from back surface 206. Front surface 204 is configured to have a higher reflection coefficient than back surface 206 for light emitted from LED package 210.

Reflector 200 further comprises a substrate interconnect 212 physically associated with reflector interconnect 202 on back surface 206.

In some embodiments substrate interconnect 212 is configured to have direct thermal contact with reflector interconnect 202, thereby contributing to heat management of reflector 200 by increasing heat dissipation therefrom. In some embodiments interconnect substrate 212 is configured to allow electrically interfacing with LED package 210 for example by providing conductive channels, for example printed conductive lines, interfacing with LED package 210 on back surface 206 through reflector interconnect 202. In some embodiments substrate interconnect 212 is configured to be physically attached to electric components or mechanical components or electro-mechanical components, additionally to reflector interconnect 202.

Reference is now made to FIG. 6B, schematically depicting, inter alia, details of the electric coupling of conducting channels of reflector interconnect 202 and substrate interconnect 212, and details of electrically interfacing LED package 210 therefrom. LED package 210 comprises a lens 214 on LED package 210 top side and over the light emitting region of LED package 210. On the bottom side LED package 210 further comprises electric contacts (not shown) configured to electrically couple with solder contacts such as solder contacts 216a and 216b.

Reflector interconnect 202 comprises a reflector segment 218 and contact segments 220a and 220b, substantially consisting of a reflector valve metal such as aluminum. The term "reflector valve metal" refers to any valve metal suitable for use in the reflector interconnect. The term is used to distinguish the valve metal of the reflector interconnect from a valve metal that may be used, according to some embodiments, in substrate interconnect 212, as is explained further below, Reflector interconnect 202 further comprises ring segments 222a and 222b substantially consisting of an oxide of the valve metal of reflector segment 218 and contact segments 220. Ring segments 222 have substantially a cylindrical shape, wherein ring segment 222a is arranged around contact segment 220a, substantially encompassing contact segment 220a, and ring segment 222b is arranged around contact segment 222b, substantially encompassing contact segment 220b, thereby ring segments 222 electrically isolate contact segment 220 from reflector segment 218.

Reflector interconnect 202 further comprises layered segments 224, consisting substantially of an oxide of the valve metal of the reflector, and similar in function to oxide segments 126 of FIGS. 5H-5K. Layered segments 224a and 214c are arranged substantially flat at corresponding regions of front surface 204 and back surface 206, respectively, around ring segment 222a and merging into ring segment 222a thereby forming a single oxide segment in reflector interconnect 202. Likewise, layered segments 224b and 224d are arranged around ring segment 222b and merging into ring segment 222b, thereby forming another oxide segment in reflector interconnect 202.

Reflector interconnect 202 further comprises electric contacts 226a and 226b on front surface 204, and 226c and 226d on back surface 206. Electric contacts 226a and 226c are electrically coupled to contact segment 220a, and are electrically isolated from reflector segment 218 by layered segments 224a and 224c, respectively, thereby forming a first distinct conductive channel across reflector interconnect 202, between front surface 204 and back surface 206. Likewise, electric contacts 226b and 226d are electrically coupled to contact segment 220b, and are electrically isolated from reflector segment 218 by layered segments 224b and 224d, respectively, thereby forming a second distinct conductive channel across reflector interconnect 202, between front surface 204 and back surface 206.

Assembling reflector interconnect 202 and LED package 210 together is carried out by soldering LED package 210 onto front surface 204, whereas a thermal paste 228 is disposed in between. Solder contact 216a, being electrically coupled to an electric contact (not shown) of LED package 210, is soldered to electric contact 226a on front surface 204, and solder contact 216b, being electrically coupled to another electric contact (not shown) of LED package 210, is soldered to electric contact 226b. Thermal paste 228 improves the thermal contact between LED package 210 and reflector interconnect 202 and facilitates heat flow therebetween, as is known in the art. LED package 210 is thereby firmly attached to reflector interconnect 202, having a direct thermal contact therewith. Further, by electrically contacting electric contacts 226c and 226d on back surface 206 electrically interfacing LED package 210 is allowed through a first conductive channel including electric contact 226c, contact segment 220a, electric contact 226a, and solder contact 216a, and through a second conductive channel including electric contact 226d, contact segment 220b, electric contact 226b and solder contact 216b.

Substrate interconnect 212 comprises a substrate segment 230 substantially consisting of a substrate valve metal such as aluminum. The term "substrate valve metal" refers to any valve metal suitable for use in the substrate interconnect. The term is used to distinguish the substrate valve metal from the reflector valve meta; the reflector valve metal may be the same or different from the substrate valve metal.

Substrate interconnect 212 further comprises layered segments 232a and 232b, substantially consisting of an oxide of the valve metal of substrate segment 230 and arranged flat on the top surface of substrate interconnect 212, facing reflector interconnect 202. Substrate interconnect 212 further comprises conductive lines 234a and 234b, on top of layered segments 232a and 232b, respectively, and electrically isolated from substrate segment 230. In some embodiments conductive lines 234a and 234b may substantially consist of shaped metallic lines produced for example by selective metallic deposition, as is described above regarding electric contacts 134 in FIG. 5K. Substrate interconnect 212 is configured to electrically couple to reflector interconnect 202 by solder contacts 236a and 236b on top of conductive lines 234a and 234b, respectively. In FIG. 6A conductive lines 234a and 234b extend outwards on the top surface of substrate interconnect 212 to electrically couple with solder contacts 238a and 238b, respectively.

Assembling substrate interconnect 212 and reflector interconnect 202 together is carried out by soldering substrate interconnect 212 onto back surface 206, whereas a thermal paste 240 is disposed in between. Solder contact 236a solders together electric contact 226c and conductive line 234a, and solder contact 236b solders together electric contact 226d and conductive line 234b. Thermal paste 240 improves the thermal contact between substrate interconnect 212 and reflector interconnect 202 and facilitates heat flow therebetween, as is described above regarding reflector interconnect 202 and LED package 210. Substrate interconnect is thereby firmly attached to reflector interconnect 202, having a direct thermal contact therewith. Further, by electrically contacting solder contacts 238a and 238b on substrate interconnect 212, electrically interfacing LED package 210 is allowed through conductive lines 234a and 234b, respectively, to electric contacts 226a and 226b, respectively, on reflector interconnect 202, and consequently to LED package 210 as is explained above.

During operation, heat that may be generated by LED package 210 may flow, at least partially, to reflector interconnect 202 wherein such heat may partly be dissipated, e.g. by radiation from reflector interconnect 202, and may partly flow further into substrate interconnect 212, to be further dissipated by any suitable mechanism, e.g. by radiation and by convection of air on the top surface and the bottom surface of substrate interconnect 212.

Reflector interconnect 202 may be coupled, substantially as described above, to a substrate interconnect substantially similar in functions to substrate interconnect 212, but comprising different materials and different technologies. In some embodiments such a substrate interconnect may be a printed circuit board (PCB). In some embodiments such a substrate interconnect may be a metal-core PCB (MCPCB). In some embodiments such a substrate interconnect may be an ALOX™ substrate as is disclosed for example in U.S. Pat. No. 6,670,704 and in WO04049424.

FIGS. 7A-7D schematically depict exemplary embodiments of a reflector in accordance with the teachings of the disclosure, comprising a multitude of LEDs. FIG. 7A schematically depicts a cross section side view of a reflector 250 comprising a reflector interconnect 252 and two LED packages, 254a and 254b, respectively. Reflector interconnect 252 is similar to reflector interconnect 202 of FIG. 6, apart from being configured to support LED packages 254a and 254b having direct thermal contact therebetween. Reflector interconnect 252 comprises a reflector segment 256 and contact segments 258a, 258b, 258c and 258d, substantially consisting of an electrically conductive valve metal. Reflector interconnect 252 further comprises ring segments 260a, 260b, 260c and 260d, substantially consisting of an oxide of the valve metal and encompassing contact segments 258a, 258b, 258c and 258d, respectively, thereby isolating the metallic segments 256 and 258 from each other. Through contact segments 258, LED packages 254 may be electrically interfaced from back surface 264 of reflector interconnect 252. Reflector interconnect 252 is suitably curved, so that light emitted from LED packages 254a and 254b is reflected from front surface 262 of reflector interconnect 252 and focused to a beam.

FIG. 7B schematically depict a cross section side view of an embodiment of a reflector 270 comprising a reflector interconnect 272 and three LED packages, 274a, 274b and 274c, respectively. Reflector 270 is substantially similar to reflector 250, apart from having some of the LED packages, specifically LED packages 274a and 274c, attached on the sides 276a and 276c of reflector interconnect 272, and not only on the center 276b of reflector interconnect 272.

FIG. 7C schematically depicts a top view of an embodiment of a reflector 280 comprising a reflector interconnect 282 and a LED package 284 comprising an array of LED chips 286. Reflector interconnect 282 comprises segments substantially consisting of a valve metal, electrically isolated from each other by encompassing segments substantially consisting of an oxide of the valve metal, substantially according to the teachings of the disclosure. Accordingly, LED package 284 may be electrically interfaced from the back surface (not shown) of reflector interconnect 282. Reflector interconnect 282 is curved so that light emitted from LEDs 286 is reflected from front surface 288 and focused to a beam.

FIG. 7D schematically depicts a perspective view of an embodiment of a reflector 290 comprising a reflector interconnect 292 and an array of LED packages 294. Reflector interconnect 292 comprises segments substantially consisting of a valve metal, electrically isolated from each other by encompassing segments substantially consisting of an oxide of the valve metal, and according to the teachings of the disclosure. Accordingly, LED packages 294 may be electrically interfaced from back surface 296 of reflector interconnect 292. Reflector interconnect 292 is curved to have a shape of a trough so that light emitted from LEDs 296 is reflected from front surface 298 and focused to a beam.

It is noted that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those features.

Although the invention is described herein in conjunction with specific embodiments thereof, it is evident that many alternatives, modifications and variations should be apparent to those skilled in the art. Accordingly, the disclosure is intended to embrace all such alternatives, modifications and variations that fall within the scope of the appended claims.

Citation or identification of any reference in this application shall not be construed as an admission that such reference is available as prior art to the invention.

Section headings are used herein to ease understanding of the specification and should not be construed as necessarily limiting.

The invention claimed is:

1. A reflector interconnect having a front surface and a back surface, the reflector interconnect comprising:
   at least two segments of a reflector valve metal; and
   at least one segment of an oxide of the reflector valve metal,
   wherein said at least two segments of the reflector valve metal are electrically isolated from each other by said at least one segment of the oxide of the reflector valve metal, and wherein said reflector interconnect is configured to support one or more electric components attached on said front surface in direct thermal contact with said reflector interconnect, and said front surface is essentially entirely reflective to electromagnetic radiation and said reflector interconnect is curved to form a concaved mirror structure, so that electromagnetic radiation radiated by at least one of said one or more electric components is reflected from said front surface and focused to a beam.

2. The reflector interconnect according to claim 1, wherein said reflector interconnect consists of a sheet having a substantially constant thickness.

3. The reflector interconnect according to claim 2, having a thickness between about 100 um and about several millimeters.

4. The reflector interconnect according to claim 1, wherein at least one of said at least two segments of the reflector valve metal in said reflector interconnect extends continuously across said reflector interconnect, between said front surface and said back surface, thereby enabling a conductive channel between a first corresponding region of said front surface and a second corresponding region of said back surface.

5. The reflector interconnect according to claim 4 wherein said at least one segment of the oxide of the reflector valve metal forms a closed loop around said first corresponding region on said front surface and forms a closed loop around said second corresponding region on said back surface and extends continuously between said front surface and said back surface thereby encompassing said at least one of said at least two segments of the reflector valve metal, thereby electrically isolating said at least one of said at least two segments of the reflector valve metal from the other segment of the at least two segments of the reflector valve metal.

6. The reflector interconnect according to claim 4, configured to support one or more electric components on said front surface in direct thermal contact with said reflector interconnect so that at least one electric contact of said electric component electrically interfaces said first region of said front surface, thereby enabling electrically interfacing said electric component from said second region of said back surface.

7. A reflector, comprising:
   a reflector interconnect according to claim 4, and
   a substrate interconnect attached to said back surface of said reflector interconnect and comprising at least one conductive channel electrically interfacing said second region of said back surface, thereby enabling electrically interfacing an electric component supported on said front surface of said reflector interconnect through said conductive channel of said substrate interconnect.

8. The reflector according to claim 7, wherein said substrate interconnect comprises a Metal-Core PCB (MCPCB).

9. The reflector according to claim 7, wherein said substrate interconnect comprises ALOX™.

10. The reflector according to claim 7, wherein said substrate interconnect comprises:

a substrate bulk comprising a segment of a substrate valve metal and a segment of an oxide of said substrate valve metal, and a metallic conductive channel physically contacting said substrate bulk and electrically isolated from said substrate valve metal by said oxide of said substrate valve metal.

11. The reflector according claim 7, wherein said substrate interconnect is in direct thermal contact with said reflector interconnect.

12. A method of producing a reflector, comprising:

providing a bulk of a reflector valve metal having a front surface and a back surface, the front surface being essentially entirely reflective to electromagnetic radiation;

selectively oxidizing a portion of the bulk, thereby obtaining a reflector interconnect, having at least two segments of reflector valve metal electrically isolated from each other by a segment of oxide of the reflector valve metal, and curving the reflector interconnect to form a concaved mirror structure by said front surface, so that electromagnetic radiation that is reflected from the front surface, is focused to a beam.

13. The method according to claim 12, further comprising configuring the reflector interconnect to support one or more electric components attached on said front surface in direct thermal contact with the reflector interconnect.

14. The method according to claim 12, further comprising configuring the front surface of the reflector interconnect to have a reflection coefficient of electromagnetic radiation higher than a reflection coefficient of electromagnetic radiation of the back surface of the reflector interconnect.

15. The reflector of claim 7, further comprising one or more electric components supported on said front surface of said reflector interconnect.

16. The reflector according to claim 15, wherein at least one of said one or more electric components is electrically interfaced from said back surface.

17. The reflector according to claim 15, wherein at least one of said one or more electric components is configured and operable to controllably radiate electromagnetic radiation.

18. The reflector according to claim 17, wherein said at least one electric component comprises a Light Emitting Diode (LED).

19. The reflector according to claim 17, wherein said at least one electric component comprises a plurality of LEDs.

20. The reflector according to claim 17, wherein said at least one electric component comprises an incandescent light bulb.

* * * * *